(12) United States Patent
Dubois et al.

(10) Patent No.: US 8,308,294 B2
(45) Date of Patent: Nov. 13, 2012

(54) METHOD OF CALCULATING AN OPTICAL SYSTEM ACCORDING TO A GIVEN SPECTACLE FRAME

(75) Inventors: Frédéric Dubois, Charenton-le-Pont (FR); David Freson, Charenton-le-Pont (FR); Benoît Holvoet-Vermaut, Charenton-le-Pont (FR)

(73) Assignee: Essilor International (Compagnie Generale d'Optique), Charenton le Pont (FR)

( * ) Notice: Subject to any disclaimer, the term of this patent is extended or adjusted under 35 U.S.C. 154(b) by 159 days.

(21) Appl. No.: 12/811,095

(22) PCT Filed: Dec. 23, 2008

(86) PCT No.: PCT/EP2008/068264
§ 371 (c)(1),
(2), (4) Date: Jun. 28, 2010

(87) PCT Pub. No.: WO2009/065962
PCT Pub. Date: May 28, 2009

(65) Prior Publication Data
US 2010/0290003 A1    Nov. 18, 2010

(30) Foreign Application Priority Data
Dec. 28, 2007   (EP) .................................... 07301761

(51) Int. Cl.
G02C 13/00    (2006.01)
G02C 7/02    (2006.01)

(52) U.S. Cl. .................................... 351/159.76; 351/178
(58) Field of Classification Search ................. 351/178, 351/90, 95, 83, 174, 159.75, 159.76, 159.77
See application file for complete search history.

(56) References Cited

U.S. PATENT DOCUMENTS

| | | | |
|---|---|---|---|
| 4,524,419 A | 6/1985 | Headlund et al. | |
| 4,630,906 A | 12/1986 | Bammert et al. | |
| 5,485,399 A | 1/1996 | Saigo et al. | |
| 6,948,816 B2 | 9/2005 | Yamamoto et al. | |
| 2002/0176052 A1 | 11/2002 | Ueno | |
| 2007/0008488 A1 | 1/2007 | Esser et al. | |
| 2007/0242220 A1 | 10/2007 | Guilloux et al. | |
| 2010/0283965 A1* | 11/2010 | Dubois et al. ................. | 351/177 |
| 2010/0283967 A1* | 11/2010 | Dubois et al. ................. | 351/177 |

FOREIGN PATENT DOCUMENTS

| | | |
|---|---|---|
| EP | 0 061 918 | 10/1982 |
| WO | WO 2007/017766 | 2/2007 |

* cited by examiner

Primary Examiner — Ricky Mack
Assistant Examiner — Zachary Wilkes
(74) Attorney, Agent, or Firm — Cozen O'Connor

(57) ABSTRACT

A method of calculating an optical system (OS) of an ophthalmic lens according to a given spectacle frame comprising the steps of: providing geometrical data of the spectacle frame, providing deformability data of the spectacle frame, providing wearer data, providing a surface curvature of a front face of the ophthalmic lens, and optimization of both the optical system (OS) and the edging parameter according to the list of the optimization criteria consisting of the geometrical and deformability data of the spectacle frame and the wearer data, so as to generate at least one optical surface different from the front surface of the lens.

22 Claims, 3 Drawing Sheets

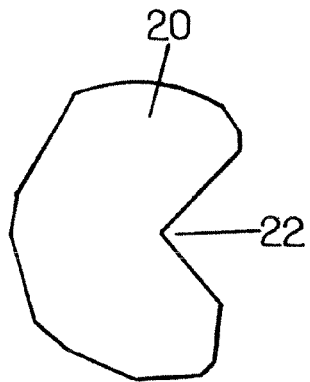
FIG 2a
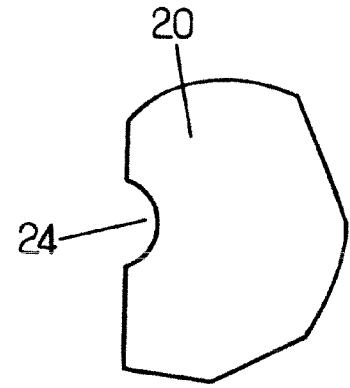
FIG 2b
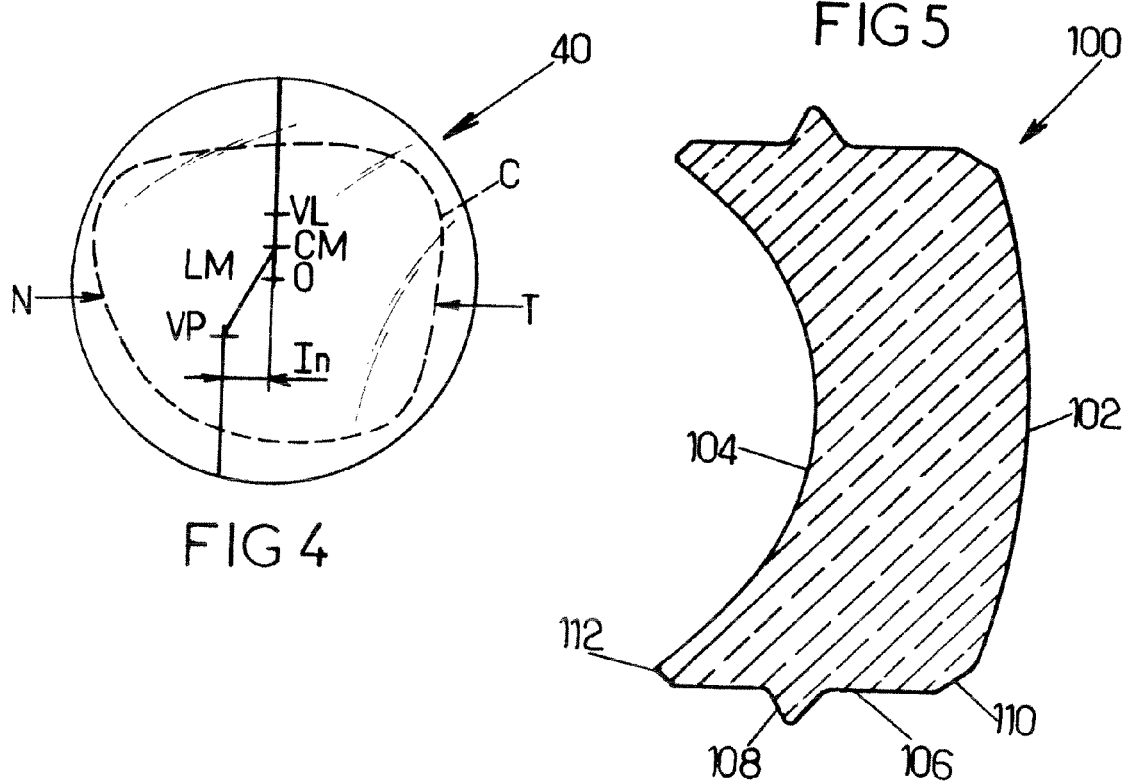
FIG 4
FIG 5

METHOD OF CALCULATING AN OPTICAL SYSTEM ACCORDING TO A GIVEN SPECTACLE FRAME

RELATED APPLICATIONS

This is a U.S. national stage of application No. PCT/EP2008/068264, filed on Dec. 23, 2008.

This application claims the priority of European application no. 07301761.8 filed Dec. 28, 2007, the entire content of which is hereby incorporated by reference.

FIELD OF THE INVENTION

The invention relates to a method of calculating an optical system (OS) of an ophthalmic lens according to a given spectacle frame.

BACKGROUND OF THE INVENTION

Usually, a person needing to wear spectacles and having thus a prescription filled by an ophthalmologist goes to the premise of an optician for choosing the frame of the future spectacles. The future wearer of the spectacles may try several spectacle frames and finally chooses one of the tried frames. The optician orders a pair of lenses corresponding to the prescription.

Depending on the practice of the optician, he can order the lenses using a "traditional" method or he may prefer to use the remote edging method.

With the traditional method, the lenses sent to the optician have been designed and manufactured according to optical criteria. The optician has to cut the lenses to the fit the spectacle frame the person has chosen.

With the remote edging method, the lenses sent to the optician have been designed, manufactured according to optical criteria and cut. The optician can fit the lenses directly in the spectacle frame the person has chosen.

The inner circumference of the openings of the chosen spectacle frame (e.g. the openings of the frame where ophthalmic lenses are intended to be mounted) can be measured very precisely by a measuring device, for example a mechanical sensor. More particularly, the openings of the frame include an inner groove and the characteristics of the groove (tilt angle with the openings, depth of the groove, etc.) can be measured by the mechanical sensor in a measuring room.

The measurements performed by the mechanical sensor on the chosen spectacle frame make it possible to order ophthalmic lenses which fit the chosen spectacle frame, on the one hand, and the wearer prescription, on the other hand.

According to the measurements performed by the mechanical sensor in the measuring room, the optician or the provider of ophthalmic lenses are able to:

determine the best semi-finished lenses for the wearer according to optical criteria, for example the wearer prescription;

edge and bevel the lenses to fit with the measurements performed on the chosen spectacle frame.

In the sense of the invention a step of cutting the lenses according to a spectacle frame shape is called "edging" and a step of forming a bevel on an external edged of the lens is called "beveling."

The lenses provider has to ensure that the provided lenses are adapted to the wearer prescription and to the chosen spectacle frame.

For example, the lenses provider has to ensure that the future lenses can effectively fit the chosen frame which may have particular openings and groove.

It will be thus understood that the measurements performed on the inner circumference openings of the chosen frame and the choice of the semi-finished lens are of great importance for the provider.

Conventionally, spectacle lenses are manufactured on request in accordance with specifications intrinsic to individual wearers. However lenses are commonly manufactured by using a limited number of semi-finished lens blanks. A semi-finished lens blank has two main faces where a face is the front face of the final lens and the other face is machined so as the optical system of the final lens fits the wearer ophthalmic prescriptions.

Semi-finished lens blanks are usually obtained by injection moulding or by casting into moulds.

The surface not to be machined of a semi-finished lens blank is conventionally called a "base-curve".

In the frame of the present invention and according to ISO Standard 13666:1998(E/F) (Ophthalmic optics—Spectacle lenses—Vocabulary), the curvature of the front face is called a "base-curve".

The front face of a semi-finished lens blank is usually intended to be the final front surface of the final lens and the other face is machined so as the optical system of the final lens fits the wearer ophthalmic prescriptions. Some minor machining of the front face may occur, but without modifying its curvature.

Semi-finished lens blanks are usually obtained by injection moulding or by casting into moulds. They also can be produced by machining a blank.

Manufacturers typically produce a series of semi-finished lens blanks, each with its own base curve. This "base-curve series" is a system of lens blanks that increases incrementally in surface power (e.g., +0.50 D, +2.00 D, +4.00 D, and so on).

The base-curves of a lens series serves as the starting point from which the remaining curves of the back surface will be calculated and the final lens be manufactured according to a wearer prescription (or focal power).

Each base-curve in a series is conventionally used for producing a range of prescription, as specified by the manufacturer. Manufacturers make base-curve selection charts available that provide the recommended prescription ranges for each base-curve in the series. An example of a typical base-curve selection chart is disclosed in patent document U.S. Pat. No. 6,948,816 where the base-curve series of FIGS. 23 A to C comprises five base-curves. The selection chart indicates the unique base-curve to be chosen according to a given prescription as a function of the spherical power SPH and of the cylindrical power CYL for curing an astigmatic vision. The disclosed selection chart relates to progressive addition lenses (progressive lens) in which a power continuously changes between a distance portion and a near portion. The same type of selection chart is widely used for every kind of ophthalmic lenses such as for example single lenses (spherical and/or torical), bi-focal lenses, aspherical lens, progressive lens.

The common trend is to limit the number of base-curves of a base-curve series in order to minimize the mould number, the stocking costs and inventory requirements. A standard base-curve series comprises less or equal to twenty base-curves, as for example equal or less or equal to ten, and preferably five to eight base-curves.

It has to be noticed that the calculation of the base-curve surfaces is a key point for each lens manufacturer, in particular when dealing with progressive lens where the progressive lens "model design" is an essential parameter of the base-curve surface. A progressive "model design" results of an optimization of the progressive surface so as to restore a presbyope's ability to see clearly at all distances but also to optimally respect all physiological visual functions such as foveal vision, extra-foveal vision, binocular vision and to minimize unwanted astigmatisms. Said progressive "model designs" are tested through rigorous clinical trials before being commercialized.

Conventionally, when the optician orders the lenses, the manufacturer selects a pair of semi-finished lenses. The selection of the semi-finished lens is based on optical criteria, such as the wearer prescription, optical comfort and the measured parameter of the spectacle frame are used for the edging and beveling steps.

The optical comfort may include a choice of the base curve of the front face of the semi-finished lens. Indeed, it is generally more comfortable for the wearer to keep the same front base as his previous ophthalmic lenses.

In some cases, the edging and beveling step can be preceded according not only to the measured shape of the spectacle frame but also according to esthetic criteria chosen by the wearer. For example, the esthetic criteria may implies having front face edges of the ophthalmic lens substantially abutting with front faces of the chosen spectacle frame when the ophthalmic lenses are fitted in the frame.

According to the esthetic criteria of the wearer and his prescription it is not always possible to meet both optical and esthetic criteria.

Usually the lens manufacturer will select the semi-finished lens according to the optical criteria and will grind a calculated design fitting the wearer prescription on the rear face of the semi-fined lens.

The person executing the edging and beveling steps, for example a edger or the optician, will receive the ophthalmic lens and will have to proceed to the edging and beveling steps according to the shape of the spectacle frame and to the esthetic criteria of the wearer.

Depending on the shape of the ophthalmic lens, it is not always possible to edge and bevel the ophthalmic lens according to the wearer criteria because of an improper lens shape (external shape of the lens, shapes of the front and rear surfaces of the lens, lens thickness, etc.).

For example, the bevel curve of the spectacle lens may be less steep compared with the curve of the frame, depending on the bevel position.

In some cases the frame is deformed so as to be matched with the bevel curve. However, deforming the frame can result in an increase of the frame size beyond the values calculated when the bevel position was selected, and thus in deficiency of the outer diameter or edge thickness of the lens. Furthermore, some spectacle frames are not deformable.

Therefore, in some cases the optician will receive a pair of lenses that can not be adapted to the spectacle frame.

One object of the present invention is to improve the situation.

SUMMARY OF THE INVENTION

One aspect of the invention relates to a method of calculating an optical system (OS) of an ophthalmic lens according to a given spectacle frame comprising the steps of:
providing geometrical data of the spectacle frame,
providing deformability data of the spectacle frame,
providing wearer data,
providing a surface curvature of the front face of the ophthalmic lens, optimization of both the optical system (OS) and the edging parameter according to the list of the optimization criteria consisting of the geometrical and deformability data of the spectacle frame and the wearer data, so as to generate at least one optical surface different from the front surface of the lens.

Advantageously, such method allows to takes into consideration the geometry and deformability of the spectacle frame when calculating the optical system and the edging parameter of an ophthalmic lens. Therefore, a face of the ophthalmic lens, for example the rear face, and the edging parameters are calculated so as to fit at the best the chosen spectacle frame.

According to further embodiments which can be considered alone or in combination:

during the optimization step edging parameters are generated;

the geometrical data of the spectacle frame includes the curve $C_f$ of the front surface of a spectacle lens, the deformability data of the spectacle frame includes the deformability coefficient $C_d$ of the spectacle lens, the front surface base corresponds to a curve $C_l$ and the edging parameter include at least a calculated bevel respecting: $|C_b - C_f| \leq C_d$, with $C_b$ the curve of the bevel;

the bevel is calculated with respect to an edge of the spectacle lens according to a specified design mode and the curve of the bevel being:

$C_b = C_f$ when $|C_f - C_l| \leq C_d$ $C_b = C_l - C_d$ when $|C_f - C_l| > C_d$ and $C_f - C_l < 0$ $C_b = C_l + C_d$ when $|C_f - C_l| > C_d$ and $C_f - C_l > 0$ before the optimization step the method further includes a step of providing an edging mode;

the first surface is the front surface of the ophthalmic lens;

the at least one generated optical surfaces is the rear surface of the ophthalmic lens;

the at least one generated optical surfaces is a diopter surface between the front and rear surface of the spectacle ophthalmic lens;

the optimization criteria further comprises the index of refraction of the optical system (OS);

the geometrical data are obtained by measuring a spectacle frame;

the geometrical data are obtained from a spectacle frame data base;

the geometrical data comprise contour parameters and a reference shape;

the geometrical data comprise 3 dimensional data of the spectacle frame;

the geometrical data comprise 2 dimensional data of the spectacle frame and curve data of the spectacle frame;

the geometrical data comprises an internal contour data of the rim of the spectacle frame;

the geometrical data of the spectacle lens further comprise geometrical data of the front face of the spectacle lens;

the optimization criteria further comprises the thickness of the spectacle lens;

the ophthalmic lens is a progressive ophthalmic lens;

the ophthalmic lens is a monofocal ophthalmic lens;

the ophthalmic lens is a multifocal ophthalmic lens;

the optical system (OS) is identified by a optical function (OF), at least two optical surfaces comprise a first optical surface (S1) defined by a first equation (ES1) and a second surface (S2) defined by a second equation (ES2), the optimization step further comprises:

a generating step (GEN), in which a virtual optical system (VOS) is used to generate a virtual function (VOF);

a modification step (MOD), in which the virtual function (VOF) is modified so as obtain the function (OF);

a calculation step (CAL), in which the second equation (ES2) is calculated from the function (OF), and the first equation (ES1).

According to another aspect, the invention relates to an ophthalmic lens manufacturing method comprising the steps of:
receiving geometrical data of a spectacle frame,
calculating an optical system (OS) of a ophthalmic lens using a method according to the invention,
manufacturing the calculated ophthalmic lens.

The calculation step can be proceeded at the manufacturer side and the receiving can be a internal receiving.

According to further embodiments which can be considered alone or in combination:
the ophthalmic lens is manufactured using a digital surfacing process;
the spectacle frame is selected at a lens order side and the geometrical data are transmitted to a computing device installed at a lens manufacturer side where the calculation steps are processed;
the spectacle frame is selected at a lens order side and after being manufactured at a lens manufacturer side, the ophthalmic lens is transmitted to the order side with edging parameters;
the spectacle frame is selected at a lens order side and after being manufactured at a lens manufacturer side, the ophthalmic lens is edged and the edged ophthalmic lens is sent to the order side;
the manufactured spectacle lens when edged is fitted in the selected spectacle frame.

Another aspect of the invention also relates to an ophthalmic lens ordering method comprising the steps of:
selecting a spectacle frame,
ordering at a lens manufacturer an ophthalmic lens manufactured according to the invention,
optionally, edging the manufactured ophthalmic lens
fitting the edged ophthalmic lens in the selected spectacle frame.

According to another aspect, the invention relates to a computer program product comprising one or more stored sequence of instruction that is accessible to a processor and which, when executed by the processor, causes the processor to carry out the steps of one of the method according to the invention.

Another aspect of the invention also relates to a computer readable medium carrying one or more sequences of instructions of the computer program according to the invention.

Unless specifically stated otherwise, the cross-section of a rim of a spectacle frame is to be understood as according to a plane comprising the geometrical center of the rim of the spectacle frame.

Unless specifically stated otherwise, the cross-section of an ophthalmic lens is to be understood as according to a plane comprising the geometrical center of the ophthalmic lens.

Unless specifically stated otherwise, the wording "optician" is to be understood as well as eye care professional.

Unless specifically stated otherwise, as apparent from the following discussions, it is appreciated that throughout the specification discussions utilizing terms such as "computing", "calculating", "generating", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer or Digital Signal Processor ("DSP") selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

BRIEF DESCRIPTION OF THE DRAWINGS

Non limiting embodiments of the invention will now be described with reference to the accompanying drawings wherein:

FIGS. 2 *a* and 2*b* are cross-sections of two type of spectacle frames;

FIG. 4 represents the contour of a progressive additional lens, before and after edging;

FIG. 5 represents a cross section of an ophthalmic lens edged to fit a closed rim frame;

Figure 1:
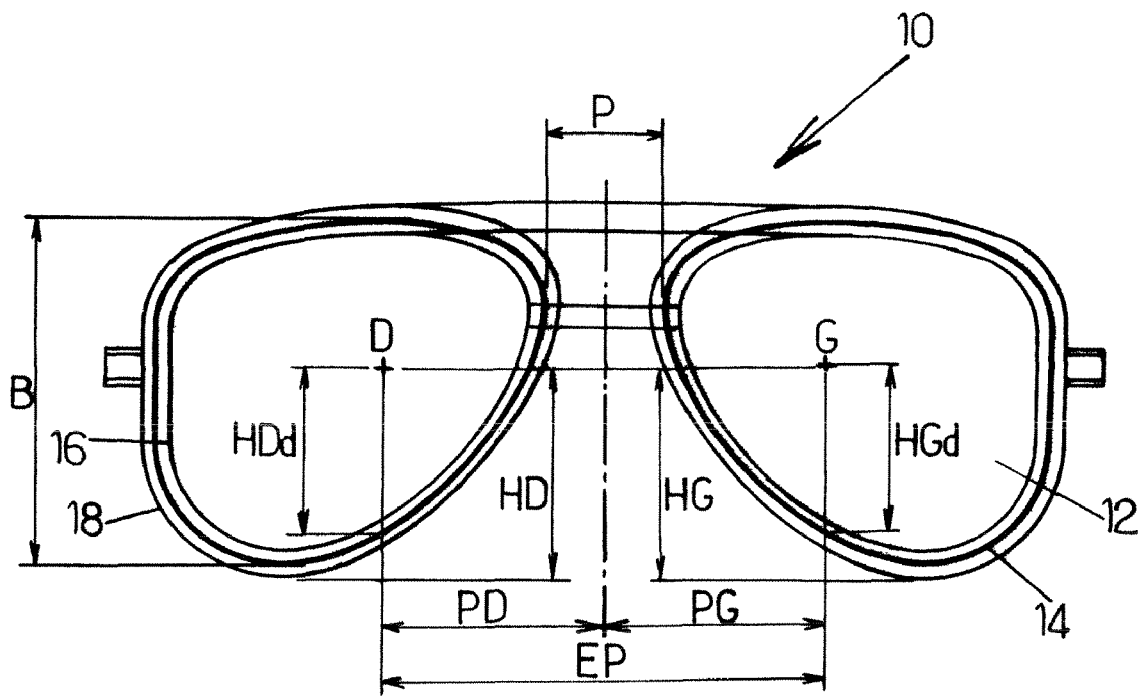
FIG. 1 *a* is the front face of a closed rim spectacle frame.

Elements in the figures are illustrated for simplicity and clarity and have not necessarily been drawn to scale. For example, the dimensions of some of the elements in the figure may be exaggerated relative to other elements to help improve the understanding of the embodiments of the present invention.

DETAILED DESCRIPTION OF THE DRAWINGS

In the framework of the invention, the following terms have the meanings indicated herein below:
optical axis of the addition lens: direction perpendicular to the front face of the lens and passing through the optical centre or the p of the latter;
distance-vision region: region of the lens that surrounds the distance-vision point, and within which the local optical characteristics of optical power and of astigmatism of the lens are substantially identical to those at the distance-vision point;
near-vision region: region of the lens that surrounds the near-vision point, and within which the local optical characteristics of optical power and of astigmatism of the lens are substantially identical to those of the near-vision point;
addition of a progressive lens: difference between the value of optical power of the lens at the near-vision point and that at the distance-vision point;

optical characteristics of a lens: data on optical power, astigmatism, aberration, etc., relating to the modifications of a light beam that passes through the lens;

prescription: set of optical characteristics of optical power, of astigmatism and, where relevant, of addition, determined by an ophthalmologist in order to correct the vision defects of an individual, for example by means of a lens positioned in front of his eye. The term 'astigmatism' is used to denote the data pair formed by an amplitude value and a value of angle. Although this is an abuse of language, it is also sometimes used to denote the amplitude of the astigmatism only. The context allows those skilled in the art to understand which usage of the term is intended. Generally speaking, the prescription for a progressive lens comprises values of optical power and of astigmatism at the distance-vision point and, where appropriate, an addition value;

surface characteristics of a lens: geometrical data relating to one face of the lens, such as values of average sphere or of cylinder, for example;

average sphere, denoted D: (N−1) times the half-sum of the inverses of the two radii of curvature of a surface expressed in meter, denoted R1 and R2, and determined at the same point on the latter. In other words: D=(N−1)×(1/R1+R2)/2, where N is the index of refraction of the lens;

cylinder, denoted C: (N−1) times the absolute value of the half-difference of the inverses of the two radii of curvature of a surface expressed in meter, determined at the same point on the latter. In other words: C=(N−1)×|1/R1−1/R2|;

"height" is used to define a lens or a lens zone dimension corresponding to a vertical when the sight is horizontal;

"width" is used to define a lens or a lens zone dimension corresponding to a horizontal when the sight is horizontal;

"curvature" of an optical surface is the curvature in a zone or at a specific point of said surface. If the surface is spherical, the curvature is constant and can be determined everywhere. If the surface is a single vision aspheric surface, its curvature is usually measured or determined at the optical center. If the surface is a progressive addition surface, its curvature is usually measured or determined at the distance-vision point. The here above mentioned points are preferred but not limiting points where a curvature according to the present invention can be measured or determined; and a "design" is a widely used wording known from the man skilled in the art to designate the set of parameters allowing to define an optical function of an generic optical system; each ophthalmic lens manufacturer has its own designs, particularly for aspherical lens and for progressive lens. As for an example, a progressive lens "design" results of an optimization of the progressive surface so as to restore a presbyope's ability to see clearly at all distances but also to optimally respect all physiological visual functions such as foveal vision, extra-foveal vision, binocular vision and to minimize unwanted astigmatisms. Progressive lens "designs" are tested through rigorous clinical trials before being commercialized.

FIG. 1 shows a representation of a spectacle frame 10 and the position of the right and left pupils of the wearer in the spectacle frame 10, which are respectively referenced D and G.

The figure shows for the frame 10 the contour of the lens in thick lines 14, and in thin lines the internal 16 and external 18 limits of the spectacle frame 10.

An element, made of plastic or another material, the contour of which corresponds to the bottom of the groove of the spectacle frame, is called the template of the spectacle frame. The template is therefore the external shape that the lens must have once cut out in order to fit in the frame spectacle.

The letter B designates the total height of the template determined with the Boxing system, i.e. according to the ISO8624 standard on systems for the measurement of lenses frames. This height corresponds to the height of a rectangle into which the lens fits once it is cut out.

An element connecting the right and left templates of the frame is called the bridge of the spectacle frame, referenced by letter P in FIG. 1.

The right interpupillary half-distance PD and the left interpupillary half-distance PG refer approximately to half of the distance between the two pupils of the wearer. For the fitting of progressive lenses, an optician measures both interpupillary half-distance PD and PG.

The left half-distance, respectively right, is the distance between the vertical axis of symmetry of the frame and the centre of the left pupil, respectively right.

Right boxing height HD, respectively left boxing height HG, refers to the vertical distance between the right pupil, respectively left and the lowest point of the right half-frame, respectively left height.

For the fitting of progressive lenses, the optician then measures the DATUM heights referenced HDd and HGd in FIG. 1. These right and left reference heights are respectively the distances between the right or left pupil and the right or left intersection between a vertical line passing through the pupil and the frame in its lower part.

The measurements of interpupillary distance and of height of the pupil relative to the frame are carried out for a given position of the wearer, namely for the wearer looking at infinity with his head straight.

The features of a given frame can be measured on the frame, using a device known in the art. For example, US-A-5 333 412 describes a device which makes it possible to measure in 3-dimensions, the shape of the bottom of the groove of the frame. The shape thus determined then makes it possible to calculate the height B.

The features of a frame can also be given directly by the manufacturer according to the model chosen by the wearer.

Using the data thus defined, each lens is cut out such that the fitting cross CM is situated in the frame facing the pupil of the corresponding eye, when the wearer looks at infinity with his head straight.

Consequently, when the wearer of the frame looks at infinity with his head straight, his viewing passes through the lens at the fitting cross. It is of course possible, if the fitting cross is not marked on the lens, to use the medium of the micro-marks for positioning the lenses, after correction by the distance between this medium and the fitting cross.

FIGS. 2a and 2b show cross sections of two different rims of spectacle frames.

The rim 20 on FIG. 2a has a V-shaped groove 22, usually corresponding to metal or plastic closed spectacle frame. The lens to be fitted in such closed spectacle frame is bevelled so as to have a corresponding Λ-shaped bevel.

The rim 20 on FIG. 2b has a U-shaped groove 24, usually corresponding to semi-rimless spectacle frame. The lens to be fitted in such semi-rimless spectacle frame is bevelled so as to have a corresponding U-shaped bevel and then fitted in the spectacle frame using a retaining cord.

Figure 3:
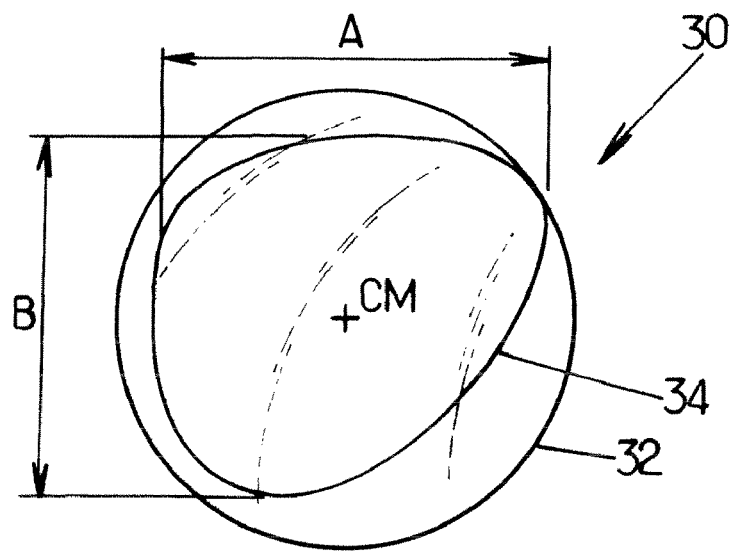
FIG. 3 represents the contour of an ophthalmic lens, before and after edging.

FIG. 3 shows a representation of the contour of an ophthalmic lens, before and after edging. In the figure, the thin line corresponds to the contour of the lens before edging; in a standard manner, the lens has a circular shape. The thick line corresponds to the contour of the template of the frame, which is also the contour of the lens after edging the lens. This edging of the lens followed or combined with a bevelling step allows the subsequent fitting of the lens in the spectacle frame.

FIG. 3 shows the total width A of the template of the frame and the total height B of this template, i.e. the width and the height of the rectangle into which the cut-out lens fits. As explained above, the positioning of the lens in the frame consists in determining the desired position of the lens in the frame, using positioning data, for example notable points of the lens.

For example, the fitting cross of the lens, the medium of micro-marks marked on the surface of the lens, or also the optical centre in the case of a single vision lens can be used. In FIG. 3, the fitting cross is marked by the cross referenced CM.

For a lens which does not have a rotational symmetry, it is also necessary to carry out an angular positioning of the lens in the frame.

FIG. 4 shows schematically an addition lens, before the latter has been edged around a contour C to the dimensions of a frame. In the figure, the nasal and temporal sides of the lens, respectively denoted N and T, the meridian line LM, the distance-vision and near-vision points, respectively denoted VL and VP, the inset In, and an optical centre of the lens, denoted O, are indicated.

FIG. 5 shows a cross section of an edged and bevelled ophthalmic lens 100. Such ophthalmic lens presents a front face 102 and a rear face 104 and an external periphery 106.

The rear face 104 is the face the closest to the eye of the wearer when the ophthalmic lens is fitted on the frame. Usually the rear face 104 is concave and the front face 102 is convex.

The external periphery 106 is preceded during the edging and bevelling steps. As represented on FIG. 5 the external periphery presents fitting means, in this case a bevel 108. As discussed previously, the geometry of the bevel, in particular its position and shape, depends on the spectacle frame in which the ophthalmic lens is to be fitted.

Optionally, the external periphery of the lens can present a front face counter bevel 110 and a rear face counter bevel 112.

The present invention relates to a method of calculating an optical system (OS) of an ophthalmic lens according to a given spectacle frame comprising the steps of:
providing geometrical data of the spectacle frame,
providing deformability data of the spectacle frame,
providing wearer data,
providing a surface curvature of a front face of the ophthalmic lens,
optimization of both the optical system (OS) and the edging parameter according to the list of the optimization criteria consisting of the geometrical and deformability data of the spectacle frame and the wearer data, so as to generate at least one optical surface different from the front surface of the lens.

In the sense of the invention, the final ophthalmic lens may be of any type of known lens, for example uncoloured lens or photochromic lens or solar lens.

In the sense of the invention, the geometrical data include at least contour and shape data.

The contour data may be chosen from, but not limited to, the list comprising:

3 D perimeter of one of the face of the spectacle frame or of the bottom of the groove,
the distance in at least one point between the groove bottom and one of the faces of the spectacle frame.

The shape data may be chosen from, but not limited to, the list comprising:
the tangent at the surface of the front face of the spectacle frame,
a 3D digital representation of the spectacle frame,
the average tore, sphere, cylinder of the front face of the spectacle frame,
the dihedral angle,
the 3D digital representation of the interior profile of the spectacle frame,
the tilt angle of the spectacle frame.

According to the invention, the geometrical data can be obtained by measuring a given spectacle frame using a measuring device well known in the art. Advantageously, the accuracy of the geometrical data is improved. Indeed, although the spectacle frames are produced based on a reference frame, small geometrical differences may exist between a given frame and the reference frame.

The geometrical data can also be obtained from a spectacle frame data base. Advantageously such method is less time consuming.

The geometrical data may also be obtained by a combination of measurements and use of a data base.

According to different embodiment of the invention, the geometrical data may comprise, but is not limited to:
actual contour parameters and a reference shape,
3 dimensional data of the spectacle frame,
2 dimensional data of the spectacle frame and curve data of the spectacle frame,
an internal profile data of the rim of the spectacle frame,
geometrical data of the front face of the spectacle frame.

According to the invention the deformability data of the spectacle frame includes the deformability coefficient $C_d$ of the spectacle lens.

The deformability coefficient $C_d$ may be preset for each frame materials or may be set according to esthetic criteria specified by the wearer.

The deformability coefficient may be expressed in diopter, corresponding to the difference between the average tore of the spectacle frame when deformed and the average tore of the spectacle frame when not deformed, both expressed in refraction index of 1.53.

The method according to the invention comprises a step of providing the surface curvature of a face of the ophthalmic lens, for example the front face.

As explained previously, the wearer may wish to have a specific front base of the ophthalmic lens.

For example the front base may be selected according to optical comfort criteria. Indeed it is generally more comfortable for the wearer to keep the same front base as his previous ophthalmic lenses.

The front base may also be selected according to esthetic criteria. The wearer may wish to have the front base of the optical lens substantially equal to the front base of the spectacle frame.

The curvature of the front face may also be selected according to optical criteria. Indeed for a given prescription they may be a preferred semi-finished lens.

In such cases the surface curvature of the front face of the ophthalmic lens is provided and the semi-finished lens is selected according to the specific front base and to the wearer prescription.

According to the invention, the wearer data comprise at least the wearer prescription data, and may also comprise elements chosen from, but not limited to, the list comprising:
- monocular PD,
- fitting point height,
- the pantoscopic angle,
- the choice of an esthetic criteria, for example: "1:1", "1:2", "Front curve tracing".

The "front curve tracing" is a criterion in which the bevel is formed so as to adjoin the front surface of the lens with the front surface of the spectacle frame.

The "1:1" is a criterion in which the bevel is formed on the external edge of the ophthalmic lens at equidistance of the front and rear face of the ophthalmic lens.

The "1:2" is a criterion in which the bevel is formed on the external edge of the ophthalmic lens so as to have the distance between the bevel and the front face of the lens equal to ½ of the distance between the bevel and the rear face of the lens.

According to the invention, the prescription data may include little or no vision correction. For example, when the ophthalmic lens is a solar lens, the prescription may comprise no vision correction.

In addition to the wearer data the method according to the invention may comprise a step of providing customization data. The customization data may be chosen from, but not limited to, the list comprising:
- the style of life of the wearer,
- the wearer preference,
- the wearer habits.

The optimization step of the method according to the invention may depend do the wearer data and the customization data.

Positioning data may be used to optimize the optical system. According to the invention, the "positioning parameters" include at least the 3D or 2D position of a face of the lens according to the contour of a face of the spectacle frame.

The positioning parameters may be chosen from, but not limited to, the list comprising:
- a 3D perimeter of the bevel of the ophthalmic lens,
- the distance between the bevel of the ophthalmic lens and the surfaces of one of the face of the ophthalmic lens,
- engravings that indicate optical point of reference on one of the surface of the optical lens, for example the PRP.

The optimization step is described in greater details when the optical system is calculated so as to position the front face of the ophthalmic lens according to the front face of the spectacle lens, with the "front curve tracing" esthetic criteria selected.

The optimization step according to the invention comprises first the optimization of an optical surface of the ophthalmic lens different from the front surface of the ophthalmic lens. The optimization step also comprises the optimization of the edging parameters associate with the selected semi-finish lens and spectacle frame.

In the sense of the invention edging parameters include at least the 2D or 3D position and shape of the bevel on the external profile of the ophthalmic lens.

The edging parameters include at least a calculated bevel respecting: $|C_b - C_f| \leq C_d$, with $C_b$ the curvature of the bevel, $C_f$ the curvature of the front face of the spectacle frame, $C_l$ the curvature of the front face of the ophthalmic lens and $C_d$ the deformability coefficient of the spectacle frame. The bevel may be calculated with respect to an edge of the spectacle lens according to a specified design mode and the curve of the bevel being:

$C_b = C_f$ when $|C_l - C_f| \leq C_d$ $C_b = C_l - C_d$ when $|C_l - C_f| > C_d$ and $C_l - C_f < 0$ $C_b = C_l + C_d$ when $|C_l - C_f| > C_d$ and $C_l - C_f > 0$ The optimization step may include generating the edging parameters.

During the optimization step of the method according to the invention the generated optical surface may be chosen from the list comprising:
- the rear surface of the lens,
- a diopter surface between the front and rear surface of the lens.

The generated optical surface should be adapted to the wearer prescription. The application WO 2007/017766 teaches a method when having a first surface of an optical system to calculate a second surface of the optical system according to a given prescription.

In the different embodiments describe hereafter, the positioning parameter are generated according to positions criteria of the ophthalmic lens in the spectacle frame. The rear face of the ophthalmic lens and/or a diopter surface between the front an rear face of the ophthalmic lens are generated according not only the geometry of the front surface of the lens but also according to optical criteria, in particular to the wearer prescription.

Figure 6:
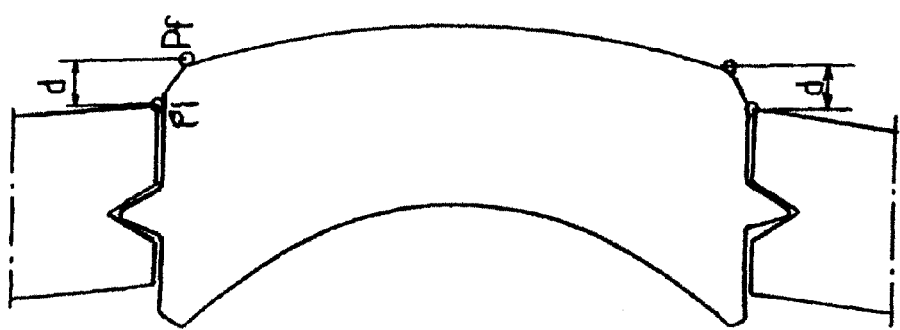

According to an embodiment, illustrated on FIG. 6, the optical system and the edging parameter of the ophthalmic lens are calculated so as to position the front face of the ophthalmic lens at a given distance from the front face of the spectacle frame.

The given distance can be chosen by the wearer according to esthetic criteria, if not esthetic criterion is specified it can be considered that the "front curve tracing" criterion is applied.

The "front curve tracing" criteria corresponds to the distance between the front face of the spectacle frame and the front face of the lens as small as possible.

According to an embodiment where the "front curve tracing" criteria has been chosen, the positioning parameter of the ophthalmic lens are calculated so as to have the distance d between the Pf and Pl be smaller than 1 mm, preferably smaller than 0.5 mm, preferably smaller than 0.1 mm.

Pf being the junction point between the front face of the spectacle frame and the internal profile of the spectacle frame.

Pl being the junction point between the front face of the ophthalmic lens and the external profile of the ophthalmic lens.

The distance d is calculated in a cross-section, therefore, the criterion should be continually applied for most of the cross sections of the spectacle frame, for example more than 50%, more than 70%, more than 80%, more than 90%, substantially 100%.

In this embodiment the curvature of the front face of the spectacle frame is measured using a measuring device at the optician side.

The front face of the semi-finished lens is selected by the lens manufacturer according to optical criteria, for example the wearer prescription.

The bevel is calculated so as to have a curvature $C_b$:

$C_b = C_f$ when $|C_l - C_f| \leq C_d$ $C_b = C_l - C_d$ when $|C_l - C_f| > C_d$ and $C_l - C_f < 0$ $C_b = C_l + C_d$ when $|C_l - C_f| > C_d$ and $C_l - C_f > 0$ with $C_b$ the curvature of the bevel, $C_f$ the curvature of the front face of the spectacle frame, $C_l$ the curvature of the front face of the ophthalmic lens and $C_d$ the deformability coefficient of the spectacle frame.

Figure 9:
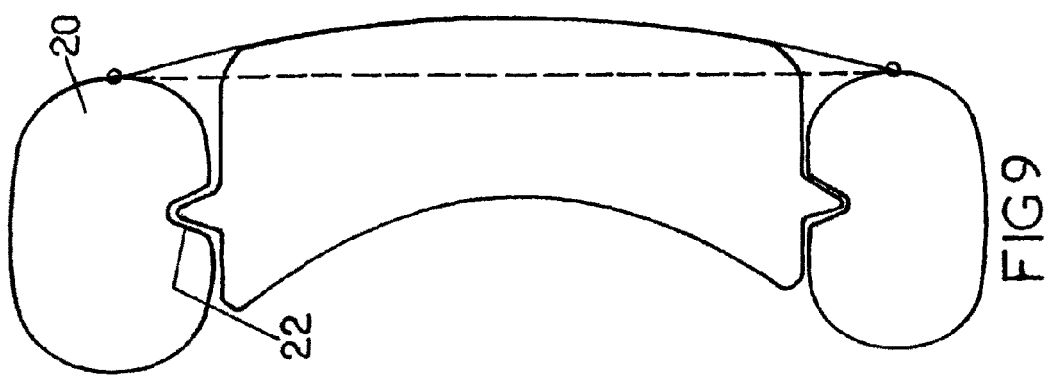
FIGS. 6 to 9 represents cross-sections of an ophthalmic lens fitted in a spectacle frame, the optical system of the ophthalmic lens have been calculated according to different criteria.
Figure 8:
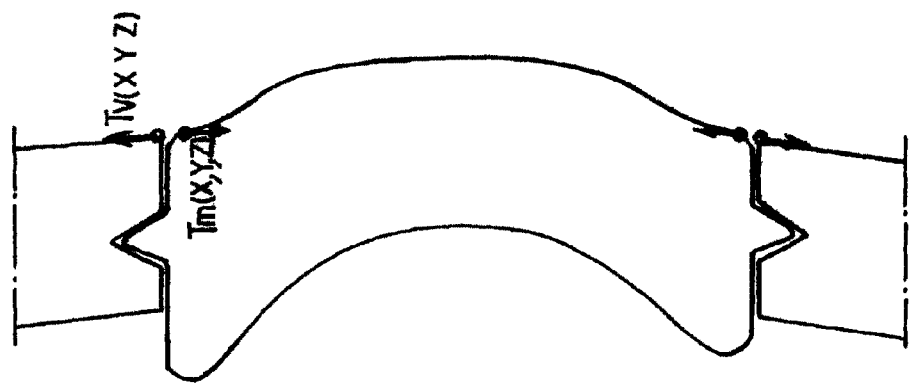
Figure 7:
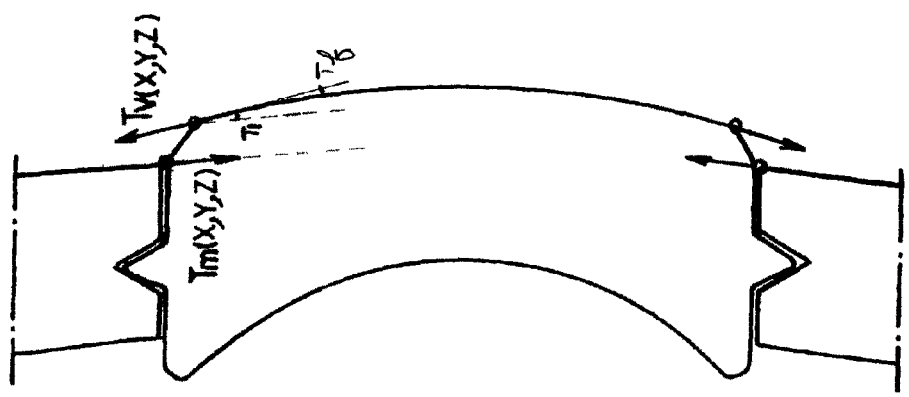

FIGS. 7 to 9 illustrate different ways of defining the difference between the front face of the ophthalmic lens and the front face of the optical lens.

As illustrated on FIG. 7, the difference between the front face of the ophthalmic lens and the front face of the optical lens may be express with the angle between Tf and Tl smaller than 15°, preferably smaller than 10°, preferably smaller than 5°.

Tf being the tangent to the front face of the spectacle frame at the point Pf, i.e., the tangent to Tv(X, Y, Z) as illustrated in FIGS. 7-8. Pf being the junction point between the front face of the spectacle frame and the internal profile of the spectacle frame.

Tl being the tangent to the front face of the ophthalmic lens at the point Pl, i.e., the tangent to Tm(X, Y, Z) as illustrated in FIGS. 7-8. Pl being the junction point between the front face of the ophthalmic lens and the external profile of the ophthalmic lens.

The angle is calculated in a cross-section, therefore, the criteria should be continually applied for most of the cross sections of the spectacle frame, for example more than 50%, more than 70%, more than 80%, more than 90%, substantially 100%.

FIG. 8 illustrates a situation where the distance d between Pf and Pl and the angle between Tf and Tl are close to zero. When such a configuration is continually applied to most of the cross-sections can be considered as having the front face of the ophthalmic lens as abutting the front face of the spectacle lens.

As illustrated on FIG. 9, the difference between the front face of the ophthalmic lens and the front face of the optical lens may be express with the average tore of the front face of the ophthalmic lens (having a refractory index of 1.53) differ of less than 0.5 Diopter, preferably of less than 0.25 Diopter, most preferably less 0.12 Diopter of the average tore of the front face of the spectacle frame.

In some embodiments the average tore can be close to a sphere.

FIG. 9 illustrates a situation where the average tore of the front face of the ophthalmic lens is sensibly equal to the average tore of the front face of the spectacle frame. When such a configuration is continually applied to most of the cross-sections can be considered as having the front face of the ophthalmic lens as abutting the front face of the spectacle lens.

The invention has been described above with the aid of an embodiment without limitation of the general inventive concept; in particular the optimization criteria are not limited to the examples discussed.

The invention claimed is:

1. A method of calculating an optical system of an ophthalmic lens according to a given spectacle frame comprising the steps of:
    providing geometrical data of the spectacle frame;
    providing deformability data of the spectacle frame;
    providing wearer data;
    providing a surface curvature of a front face of the ophthalmic lens; and
    optimization of both the optical system and edging parameter according to a list of optimization criteria consisting of the geometrical and deformability data of the spectacle frame and the wearer data, so as to generate at least one optical surface different from the front surface of the ophthalmic lens, wherein the geometrical data of the spectacle frame includes the curve $C_f$ of the front surface of a spectacle lens, the deformability data of the spectacle frame includes the deformability coefficient $C_d$ of the spectacle lens, the surface curvature of the face of the ophthalmic lens corresponds to a base curve $C_b$, and the edging parameter includes at least a calculated bevel respecting: $|C_b - C_f| \leq C_b$, where $C_b$ is the curve of the bevel.

2. The method according to claim 1, wherein during the optimization step edging parameters are generated.

3. The method according to claim 1, wherein the bevel is calculated with respect to an edge of the spectacle lens according to a specified design mode and the curve of the bevel being:

$$C_b = C_f \text{ when } |C_f - C_j| \leq C_d$$

$$C_b = C_f - C_d \text{ when } |C_f - C_j| > C_d \text{ and } C_f - C_j < 0$$

$$C_b = C_f + C_d \text{ when } |C_f - C_j| > C_d \text{ and } C_f - C_j > 0.$$

4. The method according to claim 1, wherein before the optimization step the method further includes a step of providing an edging mode.

5. The method according to claim 1, wherein the optimization criteria further comprises the index of refraction of the optical system.

6. The method according to claim 1, wherein the geometrical data are obtained by measuring a spectacle frame.

7. The method according to claim 1, wherein the geometrical data are obtained from a spectacle frame data base.

8. The method according to claim 1, wherein the geometrical data comprise contour parameters and a reference shape.

9. The method according to claim 1, wherein the geometrical data comprises an internal contour data of a rim of the spectacle frame.

10. The method according to claim 1, wherein the ophthalmic lens is a multifocal ophthalmic lens.

11. The method according to claim 1, wherein the ophthalmic lens is a monofocal ophthalmic lens.

12. The method according to claim 1, wherein the optical system is identified by an optical function, at least two optical surfaces comprise a first optical surface defined by a first equation and a second surface defined by a second equation, the optimization step further comprises:
    a generating step, in which a virtual optical system is used to generate a virtual function;
    a modification step, in which the virtual function is modified so as to obtain the optical function; and
    a calculation step, in which the second equation is calculated from the optical function, and the first equation.

13. A process in which a computer executes instructions set forth in a computer program, the computer program including instructions for executing the steps of the method of claim 1.

14. A non-transitory computer readable medium storing a computer program executable on a processor which, when used on a computer apparatus causes the processor to execute the steps of the method of claim 1.

15. An ophthalmic lens manufacturing method comprising the steps of:
    receiving geometrical data of a spectacle frame, receiving an optical system of a ophthalmic lens data calculated using a method according to claim 1, and
    manufacturing the calculated ophthalmic lens.

16. The method according to claim 15, wherein the spectacle frame is selected at a lens order side and the geometrical data are transmitted to a computing device installed at a lens manufacturer side where the calculation steps are processed.

17. The method according to claim 15, wherein during the optimization step edging parameters are generated, and wherein the spectacle frame is selected at a lens order side and after being manufactured at a lens manufacturer side, the ophthalmic lens is transmitted to the order side with the edging parameters.

18. The method according to claim 15, wherein the spectacle frame is selected at a lens order side and after being manufactured at a lens manufacturer side, the ophthalmic lens is edged and the edged ophthalmic lens is sent to the order side.

19. The method according to claim 15, wherein the manufactured spectacle lens when edged is fitted in the selected spectacle frame.

20. An ophthalmic lens ordering method comprising the steps of:
   selecting a spectacle frame,
   ordering at a lens manufacturer an ophthalmic lens manufactured according to claim 15,
   fitting the edged ophthalmic lens in the selected spectacle frame.

21. A process in which a computer executes instructions set forth in a computer program, the computer program including instructions for executing the steps of the method of claim 15.

22. A non-transitory computer readable medium storing computer program executable on a processor which, when used on a computer apparatus causes the processor to execute the steps of the method of claim 15.

* * * * *

UNITED STATES PATENT AND TRADEMARK OFFICE
CERTIFICATE OF CORRECTION

PATENT NO. : 8,308,294 B2
APPLICATION NO. : 12/811095
DATED : November 13, 2012
INVENTOR(S) : Frédéric Dubois et al.

It is certified that error appears in the above-identified patent and that said Letters Patent is hereby corrected as shown below:

In the Specification

At column 4, line 12 should read:

-- According to further embodiments which can be considered alone or in combination:

during the optimization step edging parameters are generated;

the geometrical data of the spectacle frame includes the curve $C_f$ of the front surface of a spectacle lens, the deformability data of the spectacle frame includes the deformability coefficient $C_d$ of the spectacle frame, the front surface base corresponds to a curve $C_l$ and the edging parameter include at least a calculated bevel respecting: $|C_b-C_f|\leq C_d$, with $C_b$ the curve of the bevel;

the bevel is calculated with respect to an edge of the spectacle lens according to a specified design mode and the curve of the bevel being:

$C_b=C_f$ when $|C_l-C_f|\leq C_d$ $C_b=C_f-C_d$ when $|C_l-C_f|>C_d$ and $C_l-C_f<0$ $C_b=C_f+C_d$ when $|C_l-C_f|>Cd$ and $C_l-C_f>0$ before the optimization step the method further includes a step of providing an edging mode;

the first surface is the front surface of the ophthalmic lens;

the at least one generated optical surfaces is the rear surface of the ophthalmic lens;

the at least one generated optical surfaces is a diopter surface between the front and rear surface of the spectacle ophthalmic lens;

the optimization criteria further comprises the index of refraction of the optical system (OS);

the geometrical data are obtained by measuring a spectacle frame;

the geometrical data are obtained from a spectacle frame data base;

Signed and Sealed this
Thirteenth Day of January, 2015

Michelle K. Lee
*Deputy Director of the United States Patent and Trademark Office* the geometrical data comprise contour parameters and a reference shape;

the geometrical data comprise 3 dimensional data of the spectacle frame;

the geometrical data comprise 2 dimensional data of the spectacle frame and curve data of the spectacle frame;

the geometrical data comprises an internal contour data of the rim of the spectacle frame;

the geometrical data of the spectacle lens further comprise geometrical data of the front face of the spectacle lens;

the optimization criteria further comprises the thickness of the spectacle lens;
the ophthalmic lens is a progressive ophthalmic lens;

the ophthalmic lens is a monofocal ophthalmic lens;

the ophthalmic lens is a multifocal ophthalmic lens;

the optical system (OS) is identified by a optical function (OF), at least two optical surfaces comprise a first optical surface (S1) defined by a first equation (ES1) and a second surface (S2) defined by a second equation (ES2), the optimization step further comprises:

a generating step (GEN), in which a virtual optical system (VOS) is used to generate a virtual function (VOF);

a modification step (MOD), in which the virtual function (VOF) is modified so as obtain the function (OF);

a calculation step (CAL), in which the second equation (ES2) is calculated from the function (OF), and the first equation (ES1). --

In the Claims

At column 13, line 52 should read:

-- The invention claimed:

1. A method of calculating an optical system of an ophthalmic lens according to a given spectacle frame comprising the steps of:

providing geometrical data of the spectacle frame;

providing deformability data of the spectacle frame;

providing wearer data;

providing a surface curvature of a front face of the ophthalmic lens; and optimization of both the optical system and edging parameter according to a list of optimization criteria consisting of the geometrical and deformability data of the spectacle frame and the wearer data, so as to generate at least one optical surface different from the front surface of the ophthalmic lens, wherein the geometrical data of the spectacle frame includes the curve $C_f$ of the front surface of a spectacle lens, the deformability data of the spectacle frame includes the deformability coefficient $C_d$ of the spectacle frame, the surface curvature of the face of the ophthalmic lens corresponds to a base curve $C_f$, and the edging parameter includes at least a calculated bevel respecting: $|C_b - C_f| \leq C_b$, where $C_b$ is the curve of the bevel. --